(12) United States Patent
Aoki

(10) Patent No.: US 6,850,090 B2
(45) Date of Patent: Feb. 1, 2005

(54) LEVEL SHIFTER

(75) Inventor: Junichi Aoki, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/693,493

(22) Filed: Oct. 27, 2003

(65) Prior Publication Data

US 2004/0085092 A1 May 6, 2004

(30) Foreign Application Priority Data

Oct. 31, 2002 (JP) ........................................ 2002/318488

(51) Int. Cl.$^7$ .......................................... H03K 19/0175
(52) U.S. Cl. .......................................... 326/68; 326/63
(58) Field of Search ............................. 326/63, 68–74, 326/82, 83

(56) References Cited

U.S. PATENT DOCUMENTS 6,011,421 A * 1/2000 Jung ........................... 327/333
6,703,871 B2 * 3/2004 You et al. ..................... 327/52

FOREIGN PATENT DOCUMENTS

JP 3-125515 5/1991
JP 11-239051 8/1999

* cited by examiner

*Primary Examiner*—Don Le
(74) *Attorney, Agent, or Firm*—McGinn & Gibb, PLLC (57) ABSTRACT

Provided is a level shifter including: a first level shifter circuit having first and second transistors whose sources are applied with a power source voltage and drains are connected with gates of the other transistors, and third and fourth transistors whose gates are applied with input and inverted signals, drains are connected with the drains of the first and second transistors, and sources are grounded; and a second level shifter circuit having fifth and sixth transistors whose sources are grounded and drains are connected with gates of the other transistors, and seventh and eighth transistors whose sources are applied with the power source voltage, gates are applied with the input and inverted signals, and drains are connected with the drains of the fifth and sixth transistors, the drains of the first and fifth transistors and the drains of the second and eighth transistors being connected with each other, respectively.

15 Claims, 6 Drawing Sheets

LEVEL SHIFTER

BACKGROUND OF THE INVENTION

1. Field of the Invention

The present invention relates to a level shifter for converting a level of an inputted signal into another level to output the signal, and more particularly to a level shifter for level-converting an inputted high level signal into a low level signal.

2. Description of the Related Art

In recent years, an increasing number of microcomputers are designed to have a large number of devices such as an ASIC, a microprocessor, a memory, and a peripheral circuit mounted on a mother board of a computer to satisfy a desirable function. In particular, the ASIC and the microcomputer are designed such that an amplitude of a power source voltage used in the inside becomes smaller, because a reduction in consumption power and operation at a high frequency are required. For example, an internal power source voltage is 2.5V. This voltage is expected to decrease to 1.8 V, 1.5 V, and 1.2 V in the future.

In contrast to this, in many cases, in accordance with a JEDEC system interface standard or the like, data input and output operation between respective devices is conducted at 3.3V and a device such as the peripheral circuit is operated at 3.3 V. Therefore, occurrence of a situation in which the peripheral circuit is operated at a voltage different from operating voltages of the ASIC and the microcomputer is becoming more frequent. Thus, the ASIC and the microcomputer are provided with input and output buffers in order to adjust a voltage difference between the inside and the outside by level shifting.

Figure 3:
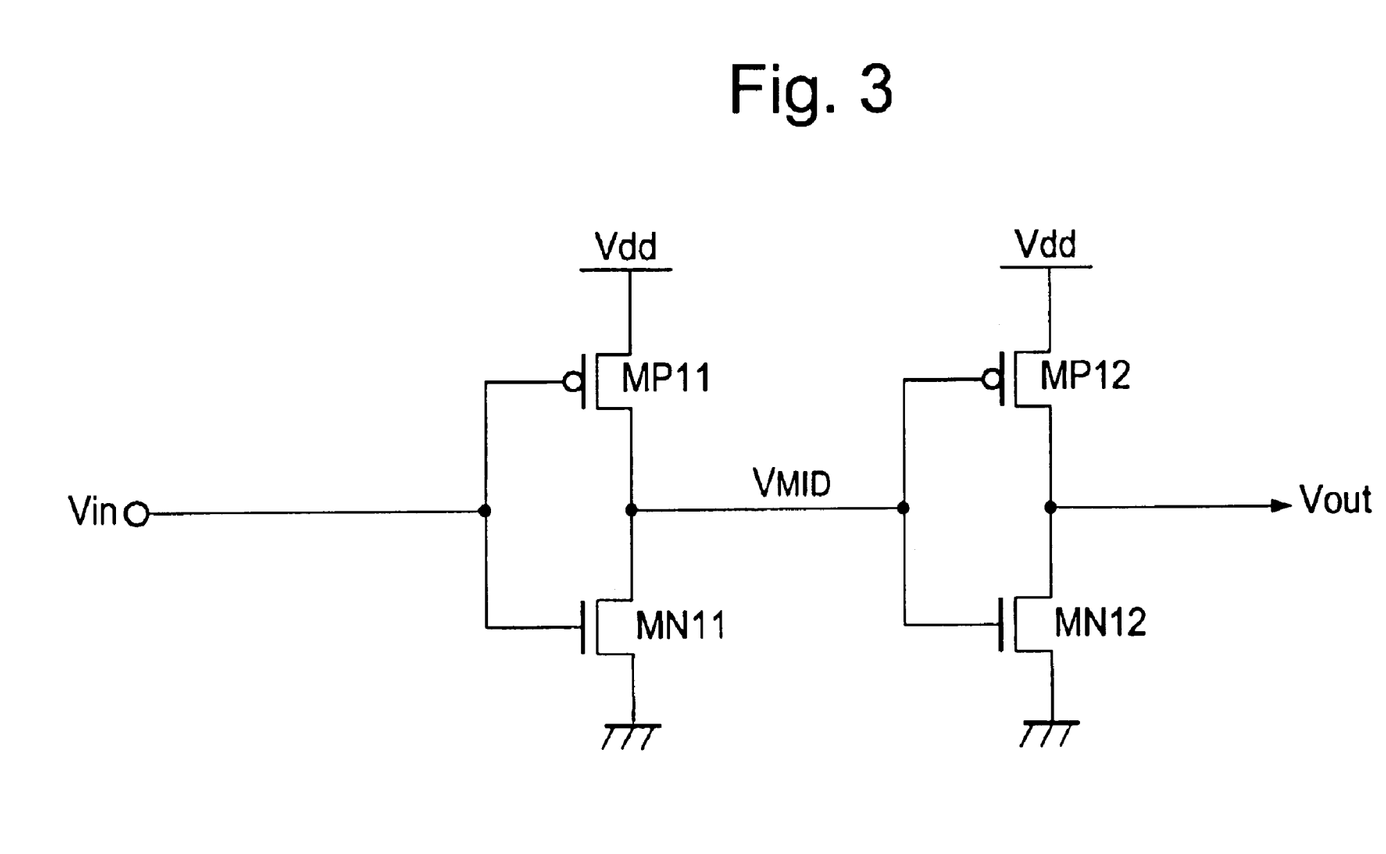
FIG. 3 is a circuit diagram showing a first conventional level shifter circuit.
Figure 4A:
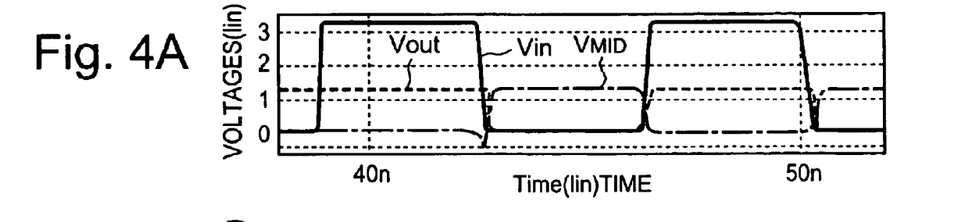
FIGS. 4A to 4F show waveforms of an input signal and an output signal in the first conventional level shifter circuit.
Figure 4B:
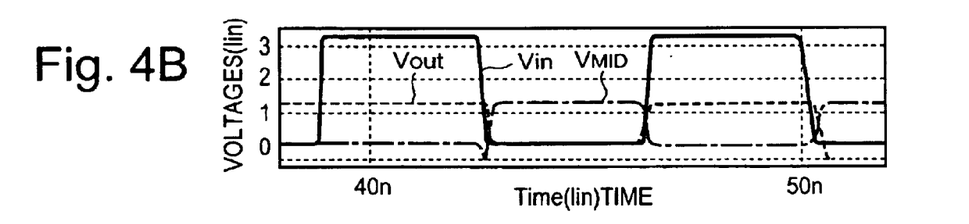
Figure 4C:
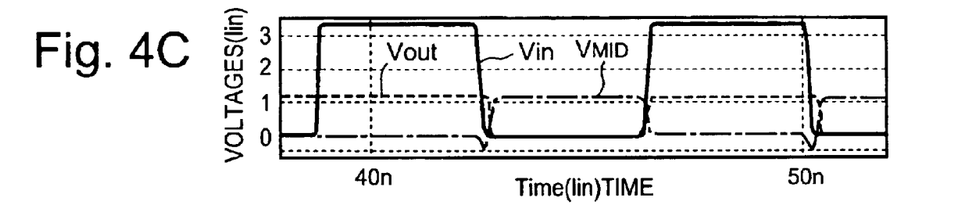
Figure 4D:
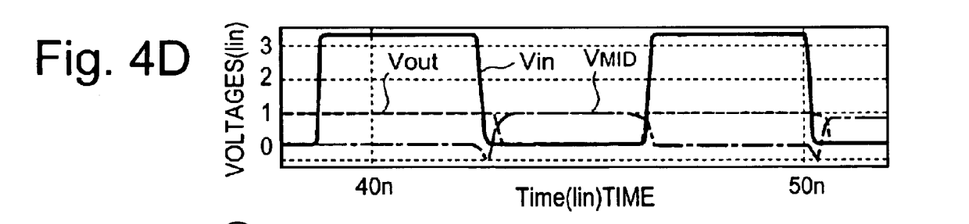
Figure 4E:
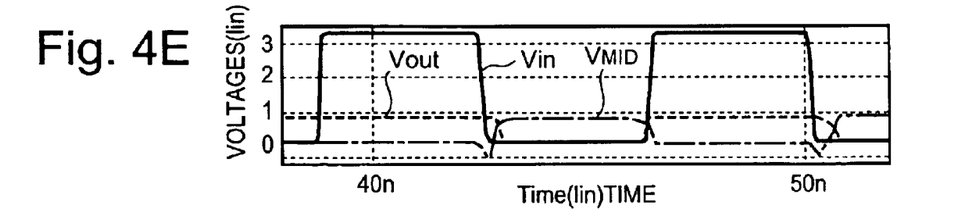
Figure 4F:
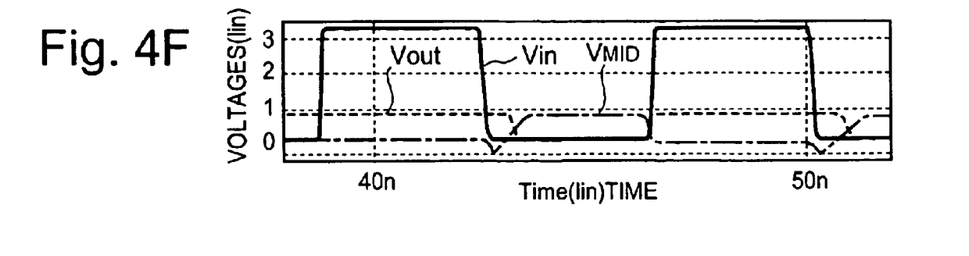

With respect to a first conventional technique, as shown in FIG. 3, there has been generally known, as an input buffer, a level shifter circuit in which a plurality of inverters are connected in series for level shifting, as an input and output buffer (for example, see JP 03-125515 A).

As shown in FIG. 3, the level shifter circuit that shifts a high voltage level to a low voltage level includes a first inverter circuit and a second inverter circuit. The first inverter circuit is composed of a P-type MOS transistor MP11 and an N-type MOS transistor MN11, which have a tolerant voltage of 3.3 V and are connected between a Vdd (1.2 V) terminal and a GND terminal and. The gates of the MOS transistors MP11 and MN11 are commonly connected with an input terminal. The second inverter circuit is composed of a P-type MOS transistor MP12 and an N-type MOS transistor MN12, which have a tolerant voltage of 1.2 V and are connected between the Vdd (1.2 V) terminal and the GND terminal. The gates of the MOS transistors MP12 and MN12 are commonly connected with the drains of the P-type MOS transistor MP11 and the N-type MOS transistor MN11. The output of the level shifter circuit is taken out from the drains of the transistors composing the second inverter circuit.

According to such a structure, it is possible that an input signal having an amplitude of 3.3 V is inverted to outputted as an inverted signal having an amplitude of 1.2 V by the first inverter circuit and then the inverted signal is inverted again to be outputted as a signal which is in phase with the input signal by the second inverter circuit.

Figure 6:
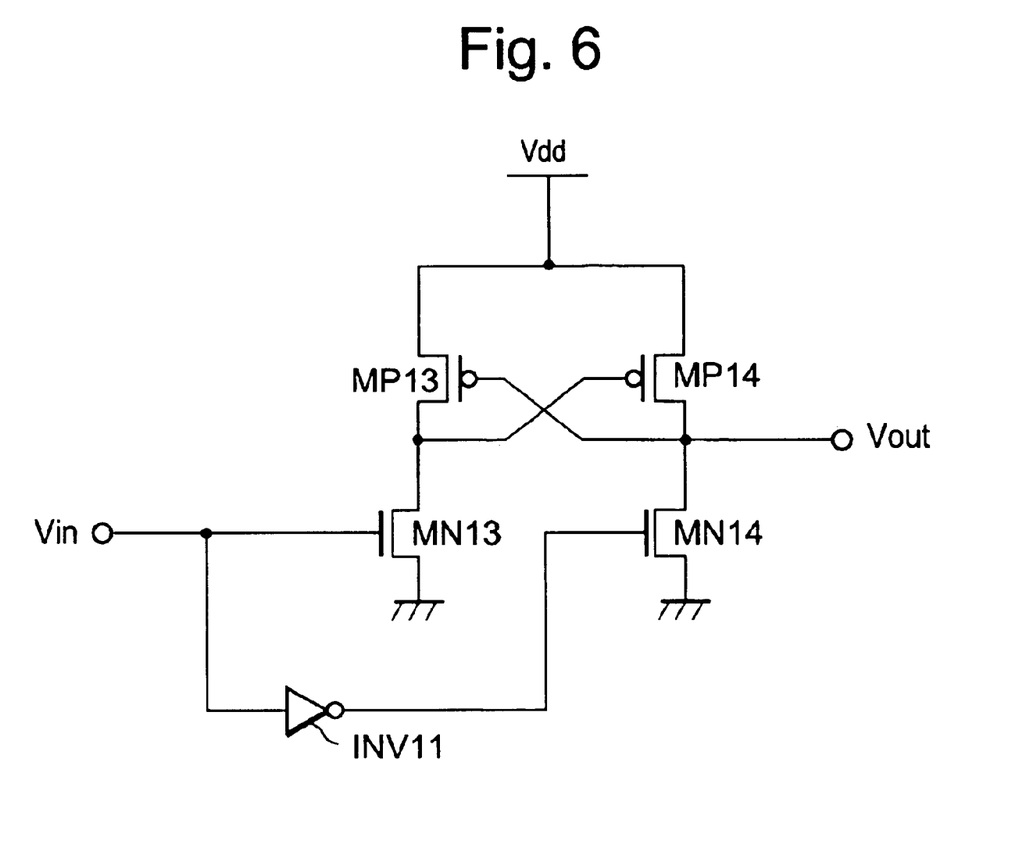
FIG. 6 is a circuit diagram showing a second conventional level shifter circuit.

Also, with respect to a second conventional technique, as shown in FIG. 6, there is another level shifter circuit provided with a CMOS inverter INV11 and a current mirror flip-flop latch circuit composed of P-type MOS transistors MP13 and MP14 and N-type MOS transistors MN13 and MN14 (for example, see JP 11-239051 A).

However, when the level shifter circuit is composed of the two inverter circuits as described in the first conventional technique, as shown in FIGS. 4A to 4F, a duty ratio of an output signal Vout reduces with respect to an input signal Vin, as a source voltage of the P-type MOS transistor of the first inverter circuit decreases.

Hereinafter, the description of the operation of the first inverter circuit will be made in the case where a threshold voltage Vtn of the N-type MOS transistor is set to 0.5 V, a threshold voltage Vtp of the P-type MOS transistor is set to 0.5 V, an amplitude of the input signal Vin is set to 3.3 V, and Vdd is set to 1.2 V.

Figure 5:
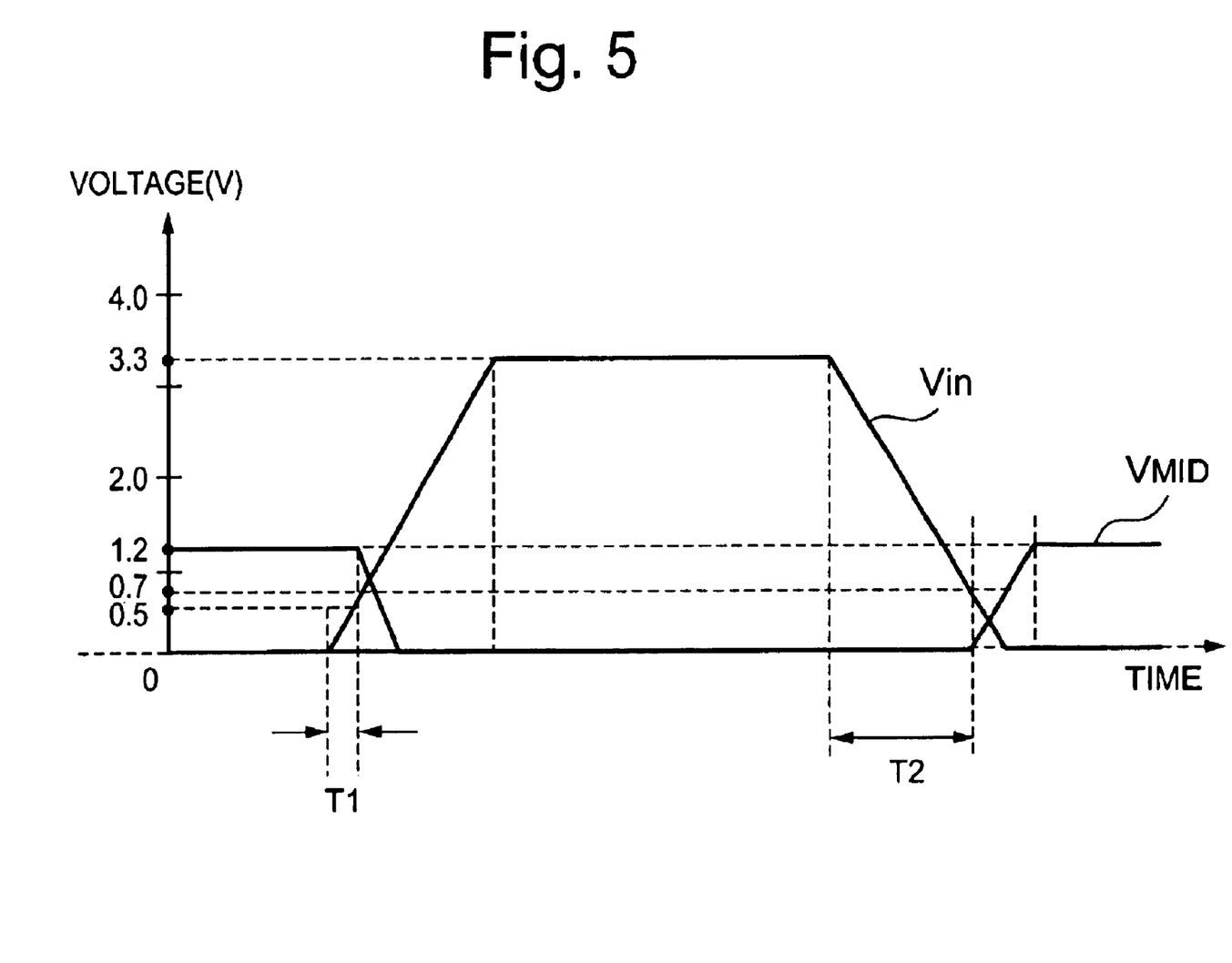
FIG. 5 shows an input and output relationship in a first stage inverter of the first conventional level shifter circuit.

Referring to FIG. 5, description will be made with respect to input and output voltage waveforms of the first inverter circuit. In the case where the input signal Vin increases from 0 V to 3.3 V, because the threshold voltage of the N-type MOS transistor is 0.5 V, the N-type MOS transistor MN11 is turned on at a time when Vin reaches 0.5 V. Then, an output signal Vmid of the first inverter circuit decreases from 1.2 V to 0 V. In contract to this, in the case where Vin decreases from 3.3 V to 0 V, the P-type MOS transistor MP11 is turned on at a time when Vin reaches 0.7 V (note that, because the threshold voltage of the P-type MOS transistor is 0.5 V and the source thereof is connected with the terminal (Vdd=1.2 V), 1.2 V−0.5 V=0.7 V is obtained). Then, the output signal Vmid of the first inverter circuit increases from 0 V to 1.2 V. Because only Vdd (=1.2 V) is applied to the source of the P-type MOS transistor, a time period T1 from the time at which Vin rises from 0 V to the time at which the N-type MOS transistor turns on is different from a time period T2 from the time at which Vin falls from 3.3V to the time at which the P-type MOS transistor turns on. Thus, a problem is caused in that a duty ratio of the output signal Vmid is different from a duty ratio of the input signal Vin in the first inverter circuit.

With respect to the second conventional technique, when Vin falls from 3.3 V, Vin is inverted by the inverter INV11 and transferred to the N-type MOS transistor MN14 to thereby turn on the N-type MOS transistor MN14, which causes a voltage of an output signal Vout to become 0 V. On the other hand, when Vin rises from 0 V, the N-type MOS transistor MN13 is turned on, so that a charge is pulled from the gate of the P-type MOS transistor MP14, which causes the voltage of the output signal Vout to become 1.2 V. As described above, the output signal Vout is determined when a gate electrode of any one of the N-type MOS transistors MN13 and MN14 becomes 3.3 V. When the output signal Vout becomes 0 V, only the N-type MOS transistor MN14 is turned on, that is, the output is changed by one stage gate. In contrast to this, when the output signal Vout becomes 1.2 V, the N-type MOS transistor MN13 is turned on and then the P-type MOS transistor MP14 is turned on. That is, the output is changed by two stage gates. Accordingly, timing of the output in the case where the output signal Vout rises is different from timing of the output in the case where the output signal Vout falls. Thus, as in the case of the first conventional technique, a problem is caused in that a duty ratio of the output signal Vout is different from a duty ratio of the input signal. Note that, because the inverter INV11 operates at an amplitude of 3.3 V, no substantial delay is caused.

The problems with respect to the first and second conventional techniques become remarkable as a frequency of the input signal becomes higher and as an amplitude difference between the input signal and the output signal increases.

SUMMARY OF THE INVENTION

Therefore, an object of the present invention is to provide a level shifter circuit in which a change in duty ratio can be reduced even when an amplitude difference between an input signal and an output signal increases, and in which a stable output signal can be supplied even when the input signal becomes a high frequency.

A first level shifter according to the present invention includes:

a first transistor connected between a first power source line and an output node;

a second transistor connected between the output node and a second power source line;

a third transistor connected between the first power source line and the output node;

a fourth transistor connected between the output node and the second power source line; and a control circuit that causes the second transistor and the fourth transistor to turn on when an input signal is of a first level, and causes the third transistor and the first transistor to turn on when the input signal is of a second level different from the first level, in which a gate tolerant voltage of the first transistor is smaller than a gate tolerant voltage of the third transistor and a gate tolerant voltage of the fourth transistor is smaller than a gate tolerant voltage of the second transistor.

A second level shifter according the present invention includes:

a first transistor of a first conductivity type having a first gate tolerant voltage, which is connected between a first power source line and a first node, in which a gate thereof receives an input signal;

a second transistor of a second conductivity type having a second gate tolerant voltage smaller than the first gate tolerant voltage, which is connected between a second power source line and a second node, in which a gate thereof is connected with the first node;

a third transistor of the first conductivity type having the first gate tolerant voltage, which is connected between the second node and the first power source line, in which a gate thereof receives an inverted input signal of the input signal;

a fourth transistor of the second conductivity type having the first gate tolerant voltage, which is connected between the second power source line and a third node, in which a gate thereof receives the input signal;

a fifth transistor of the second conductivity type having the second gate tolerant voltage, which is connected between the second power source line and the second node, in which a gate thereof receives the inverted input signal; and a sixth transistor of the first conductivity type having the second gate tolerant voltage, which is connected between the second node and the first power source line, in which a gate thereof is connected with the third node.

A third level shifter according to the present invention includes:

a first transistor of a first conductivity type, which is connected between a first power source line and a first node, in which a control terminal thereof is connected with a second node;

a second transistor of the first conductivity type, which is connected between the first power source line and the second node, in which a control terminal thereof is connected with the first node;

a third transistor of a second conductivity type, which is connected between the first node and a second power source line, in which a control terminal thereof receives an input signal;

a fourth transistor of the second conductivity type, which is connected between the second node and the second power source line, in which a control terminal thereof receives an inverted input signal of the input signal;

a fifth transistor of the first conductivity type, which is connected between the first power source line and the second node, in which a control terminal thereof receives the inverted input signal;

a sixth transistor of the second conductivity type, which is connected between the second node and the second power source line, in which a control terminal thereof is connected with a third node;

a seventh transistor of the first conductivity type, which is connected between the first power source line and the third node, in which a control terminal thereof receives the input signal; and an eighth transistor of the second conductivity type, which is connected between the third node and the second power source line, in which a control terminal thereof is connected with the second node, in which each of the first, second, sixth, and eighth transistors operates in a saturation region in accordance with a level of the input signal, and each of the third, fourth, fifth, and seventh transistors operates in a non-saturation region independently of the level of the input signal.

According to the above-mentioned structures, the rise and the fall of the output signal are caused at the same timing after the input signal is changed. Thus, a duty ratio of the output signal is not changed.

DETAILED DESCRIPTION OF THE PREFERRED EMBODIMENT

Hereinafter, an embodiment of the present invention will be described with reference to the drawings. The description will be specifically made based on the embodiment.

Figure 1:
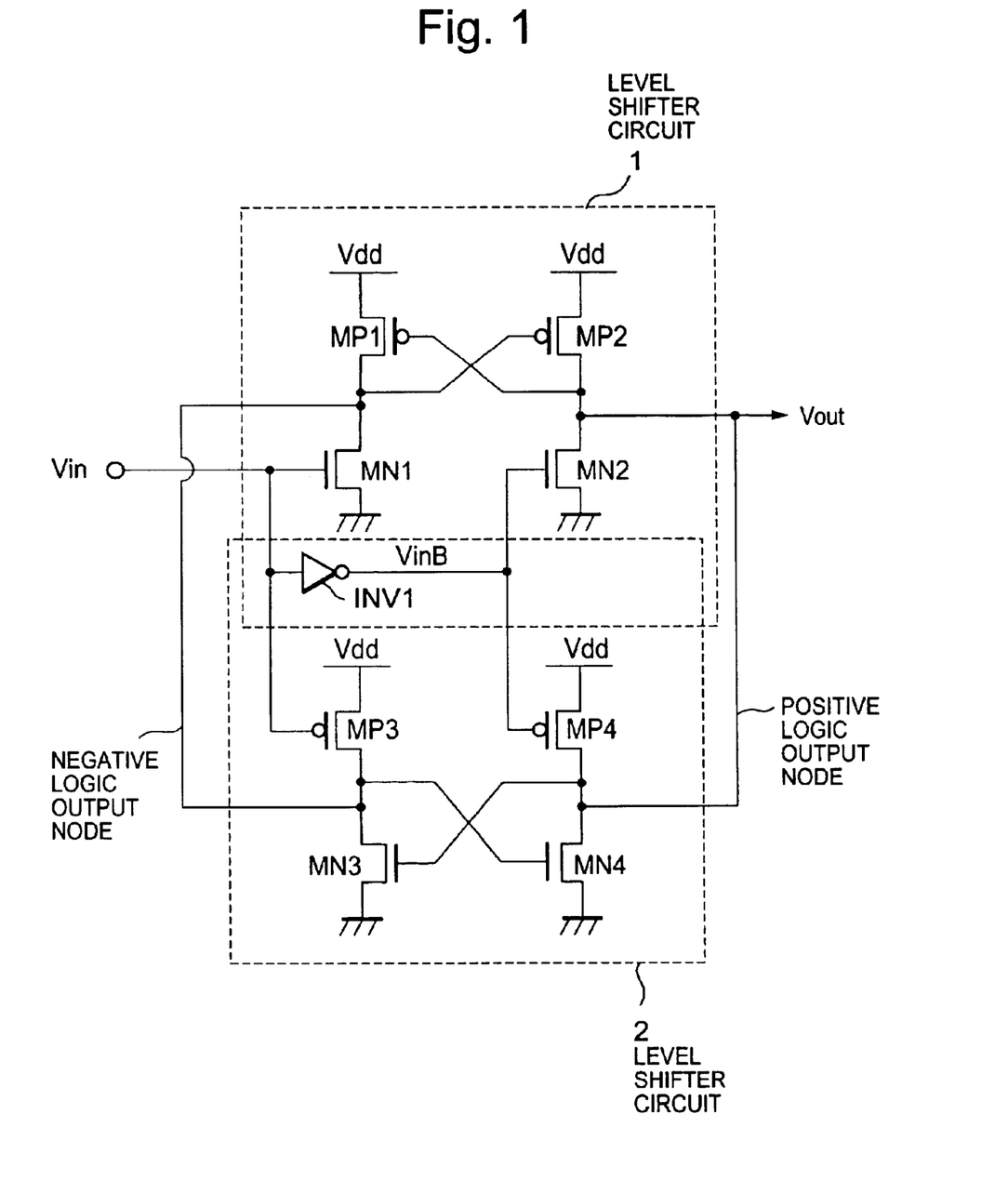
FIG. 1 is a circuit diagram showing a structure of a level shifter according to an embodiment of the present invention.
Figure 2A:
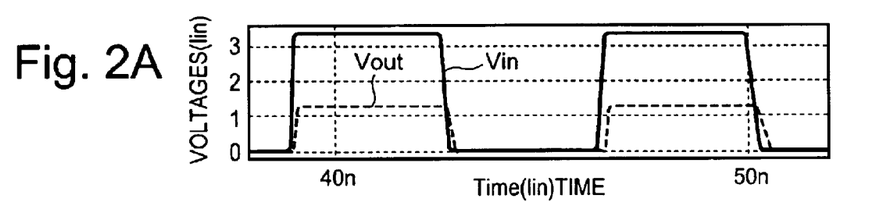
FIGS. 2A to 2F show waveforms of an input signal and an output signal in the level shifter according to the embodiment of the present invention.
Figure 2B:
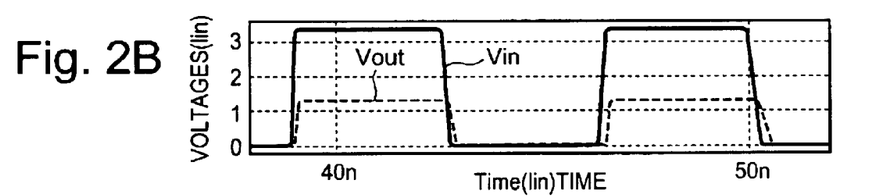
Figure 2C:
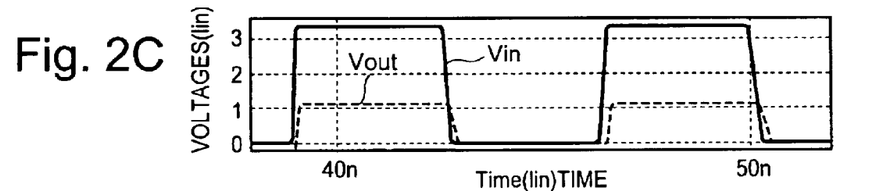
Figure 2D:
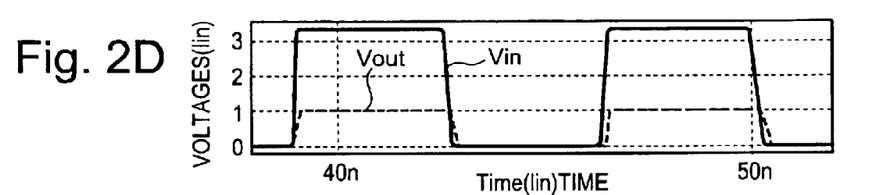
Figure 2E:
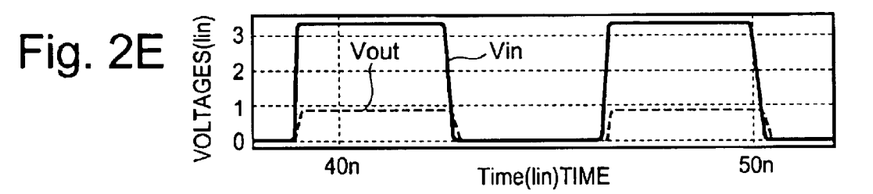
Figure 2F:
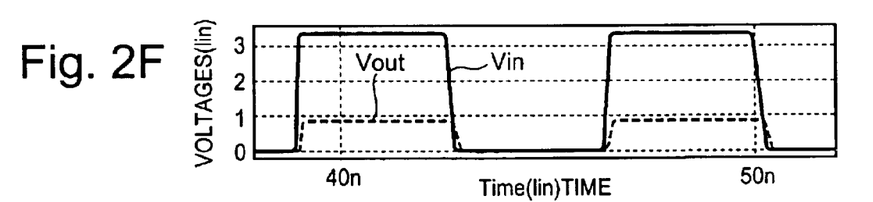

Referring to FIG. 1, the embodiment of the present invention will be described.

In this embodiment description will be made of a level shifter in the case where a level of an input signal Vin having 3.3 V is shifted to a level of an output signal Vout having 1.2 V.

A level shifter of the present invention includes a first level shifter circuit 1 and a second level shifter circuit 2.

The first level shifter circuit 1 is composed of P-type MOS transistors MP1 and MP2 and N-type MOS transistors MN1 and MN2. The P-type MOS transistor MP1 is formed from a transistor having a gate tolerant voltage of 1.2 V. The source thereof is connected with a Vdd (1.2 V) terminal. The P-type MOS transistor MP2 is formed from a transistor having a gate tolerant voltage of 1.2 V, similarly to the P-type MOS transistor MP1. The source of the P-type MOS transistor MP2 is connected with the Vdd (1.2 V) terminal, the drain thereof is connected with the gate of the P-type MOS transistor MP1, the gate thereof is connected with the drain of the P-type MOS transistor MP1. The N-type MOS transistor MN1 is formed from a transistor having a gate tolerant voltage of 3.3V. The source thereof is connected with a GND terminal, the drain thereof is connected with the drain of the P-type MOS transistor MP1, and the gate thereof receives an input signal Vin. The N-type MOS transistor MN2 is formed from a transistor having a gate tolerant voltage of 3.3 V, similarly to the N-type MOS transistor MN1. The source of the N-type MOS transistor MN2 is connected with the GND terminal, the drain thereof is connected with the drain of the P-type MOS transistor MP2, and the gate thereof receives an inverted signal VinB of the input signal Vin.

The second level shifter circuit 2 is composed of P-type MOS transistors MP3 and MP4 and N-type MOS transistors MN3 and MN4.

The P-type MOS transistor MP3 is formed from a transistor having a gate tolerant voltage of 3.3 V, and the source thereof is connected with the Vdd (1.2 V) terminal, and the gate thereof receives the input signal Vin. The P-type MOS transistor MP4 is formed from a transistor having a gate tolerant voltage of 3.3 V, similarly to the P-type MOS transistor MP3. The source of the P-type MOS transistor MP4 is connected with the Vdd (1.2 V) terminal and the gate thereof receives the inverted signal VinB. The N-type MOS transistor MN3 is formed from a transistor having a gate tolerant voltage of 1.2 V, the source thereof is connected with the GND terminal, the drain thereof is connected with the drain of the P-type MOS transistor MP3, and the gate thereof is connected with the drain of the P-type MOS transistor MP4. The N-type MOS transistor MN4 is formed from a transistor having a gate tolerant voltage of 1.2 V as in the case of the N-type MOS transistor MN3. The source of the N-type MOS transistor MN4 is connected with the GND terminal, the drain thereof is connected with the drain of the P-type MOS transistor MP4, and the gate thereof is connected with the drain of the P-type MOS transistor MP3.

Note that a connection point between the P-type MOS transistor MP1 and the N-type MOS transistor MN1 that compose the first level shifter circuit is connected with a connection point between the P-type MOS transistor MP3 and the N-type MOS transistor MN3 that compose the second level shifter circuit. Therefore, an output signal of a negative logic (amplitude is 1.2 V) to an input signal can be taken out (negative logic output nodes). Similarly, a connection point between the P-type MOS transistor MP2 and the N-type MOS transistor MN2 that compose the first level shifter circuit is connected with a connection point between the P-type MOS transistor MP4 and the N-type MOS transistor MN4 that compose the second level shifter circuit. Therefore, the output signal Vout of a positive logic (amplitude is 1.2 V) to the input signal can be taken out (positive logic output nodes).

Next, the operation of the level shifter of the present invention will be separately described with respect to the case where the input signal Vin decreases from 3.3 V to 0 V and the case where the input signal Vin increases from 0 V to 3.3 V. Here, because the inverter INV1 that produces the inverted signal VinB is designed to operate in a saturation region, the description is made with the assumption that the delay time can be neglected.

When the input signal Vin decreases from 3.3 V to 0 V, that is, when the input signal Vin falls, in the first level shifter circuit 1, the N-type MOS transistor MN1 becomes an off state due to the decrease of the input signal Vin to 0 V, and the N-type MOS transistor MN2 becomes an on state because the inverted signal VinB is changed to 3.3 V. When the N-type MOS transistor MN2 is turned on, a potential at an output terminal and a potential at the gate of the P-type MOS transistor MP1 are reduced, so that the P-type MOS transistor MP1 becomes an on state. Then, a potential at the gate of the P-type MOS transistor MP2 rises, so that the P-type MOS transistor MP2 becomes an off state. As a result, a potential on the negative logic output node rises through the P-type MOS transistor MP1 and a potential on the positive logic output node falls through the N-type MOS transistor MN2. At this time, a charge is pulled from the positive logic output node (output terminal) through the N-type MOS transistor MN2. However, because only a voltage of 1.2 V is applied between the source and the drain of the transistor having a tolerant voltage of 3.3 V, the N-type MOS transistor MN2 operates in a non-saturation region. Therefore, current pulling power (source-drain current) of the N-type MOS transistor MN2 becomes lower than that in the case where the N-type MOS MN2 transistor operates in the saturation region. Thus, it takes a long time before the output terminal reaches 0 V.

In the second level shifter circuit 2, similarly to the first level shifter circuit, the P-type MOS transistor MP3 becomes an on state in response to the fall of the input signal Vin and the P-type MOS transistor MP4 becomes an off state in response to the inverted signal VinB. When the P-type MOS transistor MP3 is turned on, a potential at the gate of the N-type MOS transistor MN4 rises, so that the N-type MOS transistor MN4 becomes a nonstate. When the P-type MOS transistor MP4 is turned off, the N-type MOS transistor MN3 becomes an off state. As a result, a potential on the negative logic output node rises through the P-type MOS transistor MP3 and a potential on the positive logic output node falls through the N-type MOS transistor MN4. At this time, because the N-type MOS transistor MN4 becomes the on state by the P-type MOS transistor MP3 turning on, the operation of the N-type MOS transistor MN4 is delayed by a time corresponding to the operation of one stage gate, as compared with the operation of the N-type MOS transistor MN2. However, because the N-type MOS transistor MN4 is composed of the transistor having the tolerant voltage of 1.2 V, it operates in the saturation region, so that the potential at the output terminal can be reduced at high speed.

Thus, the N-type MOS transistor MN2 first becomes the on state, thereby pulling a charge from the output terminal, while the N-type MOS transistor MN4 becomes the on state after the delay of a time corresponding to the operation of one stage gate, thereby pulling a charge from the output terminal. Accordingly, a time period before the output signal starts to change in response to a decrease of the input signal to 0 V can be determined by the N-type MOS transistor MN2 that has the tolerant voltage of 3.3 V and operates in the non-saturation region. In addition, a time period for which the output signal Vout decreases from 1.2 V to 0 V can be shortened by the N-type MOS transistor MN4 that has the tolerant voltage of 1.2 V and operates in the saturation region.

Next, when the input signal Vin increases from 0 V to 3.3 V, that is, when the input signal Vin rises, in the second level shifter circuit 2, the P-type MOS transistor MP3 becomes an off state because the input signal Vin is 3.3 V and the P-type MOS transistor MP4 becomes an on state because the inverted signal VinB is 0 V. When the P-type MOS transistor MP4 is in the on state, a potential at the output terminal rises. At this time, a potential at the gate of the N-type MOS transistor MN3 rises, so that the N-type MOS transistor MN3 becomes an on state. On the other hand, because the P-type MOS transistor MP3 is in the off state, a potential at the gate of the N-type MOS transistor MN4 falls, so that the N-type MOs transistor MN4 becomes an off state. As a result, a potential on the positive logic output node rises through the P-type MOS transistor MP4 and a potential on the negative logic output node falls through the N-type MOS transistor MN3.

At this time, the positive logic output node (output terminal) is charged through the P-type MOS transistor MP4. However, because only a voltage of 1.2 V is applied between the source and the drain of the transistor having the tolerant voltage of 3.3 V, the P-type MOS transistor MP4 operates in the non-saturation region. Therefore, a current supply capacity of the P-type MOS transistor MP4 becomes lower than that in the case where the P-type MOS transistor MP4 operates in the saturation region. Thus, it takes a long time before a potential at the output terminal to rise to 1.2 V.

In the first level shifter circuit, the N-type MOS transistor MN1 becomes an on state because the input signal Vin is 3.3 V and the N-type MOS transistor MN2 becomes an off state because the inverted signal VinB is 0 V. When the N-type MOS transistor MN1 becomes the on state, a potential at the gate of the P-type MOS transistor MP2 falls, so that the P-type MOS transistor MP2 becomes an on state. On the other hand, when the N-type MOS transistor MN2 becomes the off state, because the P-type MOS transistor MP2 is in the on state, the P-type MOS transistor MP1 becomes an off state. As a result, a potential on the positive logic output node rises through the P-type MOS transistor MP2 and a potential on the negative logic output node falls through the N-type MOS transistor MN1. At this time, because the P-type MOS transistor MP2 becomes the on state by the N-type MOS transistor MN1 turning on, the operation of the P-type MOS transistor MP2 is delayed by a time corresponding to the operation of one stage gate (N-type MOS transistor MN1) as compared with the operation of the P-type MOS transistor MP4. However, because the P-type MOS transistor MP2 is composed of the transistor having the tolerant voltage of 1.2 V, the P-type MOS transistor MP2 operates in the saturation region, so that a charge can be pulled from the output terminal at high speed.

Thus, the P-type MOS transistor MP4 first becomes the on state, thereby starting to charge the output terminal, while the P-type MOS transistor MP2 becomes the on state after the delay of a time corresponding to the operation of one stage gate, thereby pulling a charge from the output terminal. Accordingly, a time period before the output signal starts to change in response to an increase of the input signal to 3.3 V can be determined by the P-type MOS transistor MP4 that has the tolerant voltage of 3.3 V and operates in the non-saturation region. In addition, a time period for which the output signal Vout increases from 0 V to 1.2 V can be shortened by the P-type MOS transistor MP2 that has the tolerant voltage of 1.2 V and operates in the saturation region.

As described above, in any case where the potential at the output terminal Vout increases to 0 V or 1.2 V, the potential is started to be changed by the transistor that operates in the non-saturation region and has a high gate tolerant voltage, and then the potential is changed at high speed by the transistor that operates in the saturation region and has a low gate tolerant voltage. Accordingly, level shifting from a high voltage to a low voltage can be conducted without substantially changing a duty ratio. Note that a change in potential on the positive logic output node side (output terminal side) is described here. However, even in the negative logic output node side (inverted output terminal side), an inverse change in potential is produced by the same operating principle.

FIGS. 2A to 2F show simulation results of a level shifter to which the present invention is applied. A simulation is conducted with respect to the case where an amplitude of the input signal is set to 3.3 V and an amplitude of the output signal decreases from 1.3 V to 0.8 V by 0.1 V. As is apparent from FIGS. 2A to 2F, even when a level is shifted to 1.3 V which is a voltage equal to or lower than a half of the input signal, no duty ratio is changed. Further, even when the level is reduced to 0.8 V, no duty ratio is changed.

Note that, in this embodiment, the inverter INV1 composed of the transistor having the tolerant voltage of 3.3 V is included in both the level shifter circuits 1 and 2. When two power sources are used in an ASIC, a microprocessor, or the like, the inverter INV1 may be included in both the level shifter circuits 1 and 2. However, when a single power source is used, a structure in which the input signal and the inverted signal are supplied from the outside is preferable.

Also, in this embodiment, a start point of a change in potential at the output terminal is determined by the N-type MOS transistor MN2 and the P-type MOS transistor MP4 that have the tolerant voltage of 3.3 V, respectively. A charge and discharge period is determined by a current supply capacity of the P-type MOS transistor MP2 having the tolerant voltage of 1.2 V and a current supply capacity of the N-type MOS transistor MN4 having the tolerant voltage of 1.2 V. Accordingly, it is preferable that the current supply capacity of the P-type MOS transistor MP2 is made larger than that of the P-type MOS transistor MP1, and the current supply capacity of the N-type MOS transistor MN4 is made larger than that of the N-type MOS transistor MN3. Further, in order to rapidly turn on the P-type MOS transistor MP2 and the N-type MOS transistor MN4 that have the tolerant voltage of 1.2 V, respectively, it is preferable that a current supply capacity of the N-type MOS transistor MN1 having the tolerant voltage of 3.3 V is made larger than that of the N-type MOS transistor MN2, and a current supply capacity of the P-type MOS transistor MP3 having the tolerant voltage of 3.3 V is made larger than that of the P-type MOS transistor MP4.

Also, in this embodiment, the level shifter in which the level of the input signal having the amplitude of 3.3 V is shifted to the level of the output signal having the amplitude of 1.2 V is described. In the case of a level shifter in which an input signal having a large amplitude is converted into an output signal having a small amplitude, the amplitudes of the input signal and the output signal can be set as appropriate.

As described above, the positive logic output node of the first level shifter circuit is connected with that of the second level shifter circuit, and the negative logic output node of the first level shifter circuit is connected with that of the second level shifter circuit. Accordingly, the timing at which the output signal rises with respect to the input signal is the same as the timing at which the output signal falls with respect to the input signal, so that a duty ratio of the output signal is not changed with respect to the input signal. Thus, a level shifter in which the duty ratio is not changed even when an amplitude level difference between the input signal and the output signal increases can be provided.

What is claimed is:

1. A level shifter comprising:
   a first transistor connected between a first power source line and an output node;
   a second transistor connected between the output node and a second power source line;
   a third transistor connected between the first power source line and the output node;
   a fourth transistor connected between the output node and the second power source line; and
   a control circuit that causes the second transistor and the fourth transistor to turn on when an input signal is of a first level and causes the third transistor and the first transistor to turn on when the input signal is of a second level different from the first level,
   wherein a gate tolerant voltage of the first transistor is smaller than a gate tolerant voltage of the third transistor, and a gate tolerant voltage of the fourth transistor is smaller than a gate tolerant voltage of the second transistor.

2. A level shifter according to claim 1, wherein the control circuit comprises:
   a fifth transistor which is connected between the first power source line and a first node, agate thereof being connected with the output node;
   a sixth transistor which is connected between the first node and the second power source line, in which a gate thereof receives the input signal;
   a seventh transistor which is connected between the first power source line and a second node, in which a gate thereof receives the input signal; and
   an eighth transistor which is connected between the second node and the second power source line, a gate thereof being connected with the output node.

3. A level shifter according to claim 2, wherein the control circuit further comprises an inverter circuit that produces an inverted input signal, a polarity of which being inverted, and supplies the inverted input signal to a gate of the second transistor and a gate of the third transistor.

4. A level shifter according to claim 2, wherein each of the first, fourth, fifth, and eighth transistors has a first gate tolerant voltage, and each of the second, third, sixth, and seventh transistors has a second gate tolerant voltage.

5. A level shifter according to claim 1, wherein each of the second and third transistors operates in a non-saturation region.

6. A level shifter according to claim 1, wherein the control circuit
   causes the second transistor to turn on before turning on the fourth transistor when the input signal is of the first level and
   causes the third transistor to turn on before turning on the first transistor when the input signal is of the second level.

7. A level shifter according to claim 1, wherein a current supply capacity of the first transistor is larger than a current supply capacity of the third transistor and a current supply capacity of the fourth transistor is larger than a current supply capacity of the second transistor.

8. A level shifter according to claim 1, wherein the gate tolerant voltage of the first transistor and the gate tolerant voltage of the fourth transistor are equal to a voltage amplitude of an output signal outputted to the output node.

9. A level shifter according to claim 1, wherein the gate tolerant voltage of the second transistor and the gate tolerant voltage of the third transistor are equal to a voltage amplitude of an input signal.

10. A level shifter according to claim 2, wherein the first node and the second node are electrically connected with each other.

11. A level shifter according to claim 1, wherein the first transistor and the fourth transistor each are formed from a transistor that operates in a saturation region at a first speed and has a first current supply capacity, and the second transistor and the third transistor each are formed from a transistor that operates in a non-saturation region at a second speed lower than the first speed and has a second current supply capacity lower than the first current supply capacity.

12. A level shifter comprising:
    a first transistor of a first conductivity type having a first gate tolerant voltage, which is connected between a first power source line and a first node, in which a gate thereof receives an input signal;
    a second transistor of a second conductivity type having a second gate tolerant voltage smaller than the first gate tolerant voltage, which is connected between a second power source line and a second node, in which a gate thereof is connected with the first node;
    a third transistor of the first conductivity type having the first gate tolerant voltage, which is connected between the second node and the first power source line, in which a gate thereof receives an inverted input signal of the input signal;
    a fourth transistor of the second conductivity type having the first gate tolerant voltage, which is connected between the second power source line and a third node, in which a gate thereof receives the input signal;
    a fifth transistor of the second conductivity type having the second gate tolerant voltage, which is connected between the second power source line and the second node, in which a gate thereof receives the inverted input signal; and
    a sixth transistor of the first conductivity type having the second gate tolerant voltage, which is connected between the second node and the first power source line, in which a gate thereof is connected with the third node.

13. A level shifter according to claim 12, further comprising:
    a seventh transistor of the second conductivity type having the second gate tolerant voltage, which is connected between the first node and the second power source line, in which a gate thereof is connected with the second node; and
    an eighth transistor of the first conductivity type having the second gate tolerant voltage, which is connected between the third node and the first power source line, in which a gate thereof is connected with the second node.

14. A level shifter according to claim 13, wherein the first node and the third node are electrically connected with each other.

15. A level shifter comprising:
    a first transistor of a first conductivity type, which is connected between a first power source line and a first node, in which a control terminal thereof is connected with a second node;
    a second transistor of the first conductivity type, which is connected between the first power source line and the second node, in which a control terminal thereof is connected with the first node;

a third transistor of a second conductivity type, which is connected between the first node and a second power source line, in which a control terminal thereof receives an input signal;

a fourth transistor of the second conductivity type, which is connected between the second node and the second power source line, in which a control terminal thereof receives an inverted input signal of the input signal;

a fifth transistor of the first conductivity type, which is connected between the first power source line and the second node, in which a control terminal thereof receives the inverted input signal;

a sixth transistor of the second conductivity type, which is connected between the second node and the second power source line, in which a control terminal thereof is connected with a third node;

a seventh transistor of the first conductivity type, which is connected between the first power source line and the third node, in which a control terminal thereof receives the input signal; and an eighth transistor of the second conductivity type, which is connected between the third node and the second power source line, in which a control terminal thereof is connected with the second node, wherein each of the first, second, sixth, and eighth transistors operates in a saturation region in accordance with a level of the input signal, and each of the third, fourth, fifth, and seventh transistors operates in a non-saturation region independently of the level of the input signal.

* * * * *